(12) United States Patent
Haase

(10) Patent No.: US 8,941,566 B2
(45) Date of Patent: Jan. 27, 2015

(54) ARRAY OF LUMINESCENT ELEMENTS

(75) Inventor: Michael A. Haase, St. Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 1300 days.

(21) Appl. No.: 12/528,503

(22) PCT Filed: Feb. 26, 2008

(86) PCT No.: PCT/US2008/055004
§ 371 (c)(1),
(2), (4) Date: Aug. 25, 2009

(87) PCT Pub. No.: WO2008/109296
PCT Pub. Date: Sep. 12, 2008

(65) Prior Publication Data
US 2010/0117997 A1    May 13, 2010

(51) Int. Cl.
*G09G 3/32* (2006.01)
*G09G 3/30* (2006.01)
*H01L 27/15* (2006.01)

(52) U.S. Cl.
CPC .................................. *H01L 27/156* (2013.01)
USPC ............................................... 345/82; 345/76

(58) Field of Classification Search
USPC ........................................ 345/92, 204, 82, 76
See application file for complete search history.

(56) References Cited

U.S. PATENT DOCUMENTS

| | | | |
|---|---|---|---|
| 5,483,085 A | 1/1996 | Holm et al. | |
| 5,898,185 A | 4/1999 | Bojarczuk, Jr. et al. | |
| 5,915,193 A | 6/1999 | Tong et al. | |
| 5,936,258 A * | 8/1999 | Imamura et al. | 257/21 |
| 5,994,722 A | 11/1999 | Averbeck et al. | |
| 6,212,213 B1 | 4/2001 | Weber et al. | |
| 6,563,133 B1 | 5/2003 | Tong | |
| 6,737,801 B2 | 5/2004 | Ragle | |
| 6,987,288 B2 | 1/2006 | Rattier et al. | |
| 7,045,375 B1 * | 5/2006 | Wu et al. | 438/35 |
| 7,071,905 B1 | 7/2006 | Fan | |
| 7,083,490 B2 | 8/2006 | Mueller et al. | |
| 7,119,377 B2 | 10/2006 | Sun et al. | |
| 7,161,188 B2 | 1/2007 | Orita | |
| 7,402,831 B2 | 7/2008 | Miller et al. | |
| 7,404,756 B2 | 7/2008 | Ouderkirk et al. | |
| 7,423,297 B2 | 9/2008 | Leatherdale et al. | |

(Continued)

FOREIGN PATENT DOCUMENTS

| | | |
|---|---|---|
| CN | 1697208 | 11/2005 |
| CN | 1822083 | 8/2006 |

(Continued)

OTHER PUBLICATIONS

Search Report for PCT Application US2008/055004, 3 pages, Date of Mailing Jun. 25, 2008.

(Continued)

*Primary Examiner* — Kevin M Nguyen
*Assistant Examiner* — Kenneth B Lee, Jr.

(57) ABSTRACT

Light emitting systems and method of fabricating the same are disclosed. The light emitting system includes two or more monolithically integrated luminescent elements. Each luminescent element includes an electroluminescent device and a dedicated switching circuit for driving the electroluminescent device. At least one luminescent element includes a potential well for down converting light emitted by the electroluminescent device in the luminescent element.

13 Claims, 13 Drawing Sheets

(56) References Cited

U.S. PATENT DOCUMENTS

| | | |
|---|---|---|
| 7,471,040 B2 | 12/2008 | Nishimura |
| 2002/0015013 A1 | 2/2002 | Ragle |
| 2002/0139984 A1 | 10/2002 | Sugawara et al. |
| 2004/0012331 A1* | 1/2004 | Yamazaki et al. ............ 313/506 |
| 2004/0259363 A1* | 12/2004 | Bawendi et al. ............. 438/689 |
| 2006/0081862 A1 | 4/2006 | Chua et al. |
| 2006/0094322 A1 | 5/2006 | Ouderkirk et al. |
| 2006/0124917 A1 | 6/2006 | Miller et al. |
| 2006/0124918 A1 | 6/2006 | Miller |
| 2006/0163591 A1* | 7/2006 | Diekmann ...................... 257/89 |
| 2006/0164359 A1* | 7/2006 | Kimura ........................... 345/92 |
| 2006/0284190 A1* | 12/2006 | Zimmerman et al. .......... 257/79 |
| 2007/0018558 A1* | 1/2007 | Chua et al. .................... 313/485 |
| 2007/0116423 A1 | 5/2007 | Leatherdale et al. |
| 2007/0256453 A1 | 11/2007 | Barnes et al. |
| 2007/0284565 A1 | 12/2007 | Leatherdale et al. |
| 2007/0284603 A1 | 12/2007 | Haase |

FOREIGN PATENT DOCUMENTS

| | | |
|---|---|---|
| JP | 10261818 A2 | 9/1998 |
| JP | 2000-195672 A2 | 7/2000 |
| JP | 2003-060233 A2 | 2/2003 |
| JP | 2006-227603 | 8/2006 |
| JP | 2006-308858 A2 | 11/2006 |
| WO | WO 02/097902 | 12/2002 |
| WO | WO 03/058726 A1 | 7/2003 |
| WO | 2005103199 * | 11/2005 |
| WO | WO 2008/064068 | 5/2008 |

OTHER PUBLICATIONS

Written Opinion for PCT Application US2008/055004, 9 pages, Date of Mailing Jun. 25, 2008.

Tong et al., *Semiconductor Wafer Bonding*, chpts. 4 and 10, John Wiley & Sons, NY, pp. 49-101, 223-232 (1999).

Heliotis et al., "Spectral conversion of InGaN ultraviolet microarray light-emitting diodes using fluorine-based red-, green-, blue-, and white-light-emitting polymer overlayer films," Appl. Phys. Lett., 87, 103505 (2005).

Supplementary European Search Report for EP08730744.3, mailed Aug. 8, 2013, 3 pp.

* cited by examiner

ARRAY OF LUMINESCENT ELEMENTS

FIELD OF THE INVENTION

This invention generally relates to light emitting systems. The invention is particularly applicable to light emitting systems having two or more light emitting regions.

BACKGROUND

Illumination systems are used in many different applications, including projection display systems, backlights for liquid crystal displays and the like. Projection systems typically use one or more white light sources, such as high pressure mercury lamps. The white light beam is usually split into three primary colors, red, green and blue, and is directed to respective image forming spatial light modulators to produce an image for each primary color. The resulting primary-color image beams are combined and projected onto a projection screen for viewing.

More recently, light emitting diodes (LEDs) have been considered as an alternative to white light sources. LEDs have the potential to provide the brightness and operational lifetime that would compete with conventional light sources. Current LEDs, however, especially green emitting LEDs, are relatively inefficient.

Conventional light sources are generally bulky, inefficient in emitting one or primary colors, difficult to integrate, and tend to result in increased size and power consumption in optical systems that employ them.

SUMMARY OF THE INVENTION

Generally, the present invention relates to light emitting systems. In one embodiment, a light emitting system includes two or more monolithically integrated luminescent elements. Each luminescent element includes an electroluminescent device and a dedicated switching circuit for driving the electroluminescent device. At least one luminescent element includes a potential well for down converting light emitted by the electroluminescent device in the luminescent element.

In another embodiment, a light emitting system includes two or more monolithically integrated luminescent elements. Each luminescent element includes an electroluminescent device. At least one luminescent element includes a potential well for down converting light emitted by the electroluminescent device in the luminescent element.

In another embodiment, a light emitting system includes a first luminescent element capable of outputting light at a first wavelength; a second luminescent element capable of outputting light at a second wavelength different than the first wavelength; and a third luminescent element capable of outputting light at a third wavelength different than the first and second wavelengths. The third luminescent element includes an electroluminescent device capable of emitting light at the first wavelength; a first photoluminescent element for converting at least a portion of light emitted by the electroluminescent device from the first wavelength to the second wavelength; and a second photoluminescent element for converting at least a portion of light emitted by the electroluminescent device or light converted by the first photoluminescent element to the third wavelength.

In another embodiment, a light emitting system includes a first luminescent element capable of outputting light at a first wavelength; and a second luminescent element capable of outputting light at a second wavelength different than the first wavelength. The second luminescent element includes an electroluminescent device capable of emitting light at the first wavelength and a potential well for converting at least a portion of light emitted by the electroluminescent device from the first wavelength to the second wavelength.

In another embodiment, an optical system includes a pixelated light emitting system capable of emitting light. Each pixel includes an electroluminescent device. At least one pixel includes one or more potential wells for down converting light emitted by the electroluminescent device in the pixel; and a pixelated spatial light modulator for receiving light emitted by the pixelated light emitting system.

In another embodiment, a pixelated light emitting system is capable of forming an image and emitting light. Each pixel in the light emitting system includes an electroluminescent device. At least one pixel includes one or more potential wells for down converting light emitted by the electroluminescent device in the pixel.

In another embodiment, a display system includes a light emitting system that includes a first plurality of pixels. Each pixel has a dedicated switching circuit for controlling the output light from the pixel. At least one pixel includes an electroluminescent device and a potential well for down converting light emitted by the electroluminescent device. The display system further includes a spatial light modulator (SLM) that receives light from the light emitting system and includes a second plurality of pixels. Each pixel in the first plurality of pixels illuminates a different subset of the second plurality of pixels.

In another embodiment, a light emitting system includes two or more monolithically integrated luminescent elements. Each luminescent element is capable of outputting white light. At least one luminescent element includes a light emitting diode (LED) capable of emitting UV or blue light; a first potential well for converting at least a portion of the UV or blue light to green light; and a second potential well for converting at least a portion of the green, UV or blue light to red light.

In another embodiment, a light emitting system includes a plurality of electroluminescent devices capable of emitting light. A first light converting element covers two or more electroluminescent devices for down converting at least a portion of light emitted by the two or more electroluminescent devices.

In another embodiment, an article includes a plurality of electroluminescent devices fabricated on a first substrate; a potential well for converting light emitted by an electroluminescent device in the plurality of electroluminescent devices; and a plurality of switching circuits fabricated on a second substrate. Each switching circuit on the second substrate is designed to drive a corresponding electroluminescent device on the first substrate. The first substrate is attached to the second substrate with each switching circuit on the second substrate facing a corresponding electroluminescent device on the first substrate.

In another embodiment, a light emitting system includes a first luminescent element capable of outputting light at a first wavelength; and a second luminescent element capable of outputting light at a second wavelength different from the first wavelength. The second luminescent element includes an electroluminescent device capable of emitting light at the first wavelength; a first light converting element for converting at least a portion of light emitted by the electroluminescent device from the first wavelength to a third wavelength different from the first and second wavelengths; and a second light converting element for converting at least a portion of light converted by the first light converting element from the third wavelength to the second wavelength.

BRIEF DESCRIPTION OF DRAWINGS

The invention may be more completely understood and appreciated in consideration of the following detailed description of various embodiments of the invention in connection with the accompanying drawings, in which:

FIGS. 14A-14F are schematic representations of exemplary conduction band profiles for a potential well.

The same reference numeral used in multiple figures refers to the same or similar elements having the same or similar properties and functionalities.

DETAILED DESCRIPTION

This application teaches light sources that include an array of light emitting regions. The disclosed light sources can efficiently output light at any wavelength in, for example, the visible region of the spectrum. The light sources can be designed to output, for example, one or more primary colors or white light. The light sources can be compact with reduced weight because, for example, the array of light emitting regions can be compactly integrated onto a substrate. The emission efficiency and compactness of the disclosed light sources can lead to new and improved optical systems, such as portable projection systems, with reduced weight, size and power consumption.

The disclosed light sources can have larger and smaller light emitting regions where the output light of each region can be actively and independently controlled. The light sources can be used in, for example, a projection system to illuminate one or more pixelated image forming devices. Each light emitting region of the light source can illuminate a different portion or zone of the image forming device. Such a capability allows for efficient adaptive illumination systems where the output light intensity of a light emitting region of the light source can be actively adjusted to provide the minimum illumination required by a corresponding zone in the image forming device.

The disclosed light sources can form monochromatic (for example, green or green on black) or color images. Such disclosed light sources combine the primary functions of light sources and image forming devices resulting in reduced size, power consumption, cost and the number of element or components used in an optical system that incorporates the disclosed light sources. For example, in a display system, the disclosed light sources can function as both the light source and the image forming device, thereby eliminating or reducing the need for a backlight or a spatial light modulator. As another example, incorporating the disclosed light sources in a projection system eliminates or reduces the need for image forming devices and relay optics.

Arrays of luminescent elements, such as arrays of pixels in a display system, are disclosed in which at least some of the luminescent elements include an electroluminescent device, such an LED, capable of emitting light in response to an electric signal. Some of the luminescent elements include one or more light converting elements, such as one or potential wells and/or quantum wells, for down converting light that is emitted by the electroluminescent devices. As used herein, down converting means that the wavelength of the converted light is greater than the wavelength of the unconverted light.

Arrays of luminescent elements disclosed in this application can be used in illumination systems, such as adaptive illumination systems, for use in, for example, projection systems or other optical systems.

Figure 11:
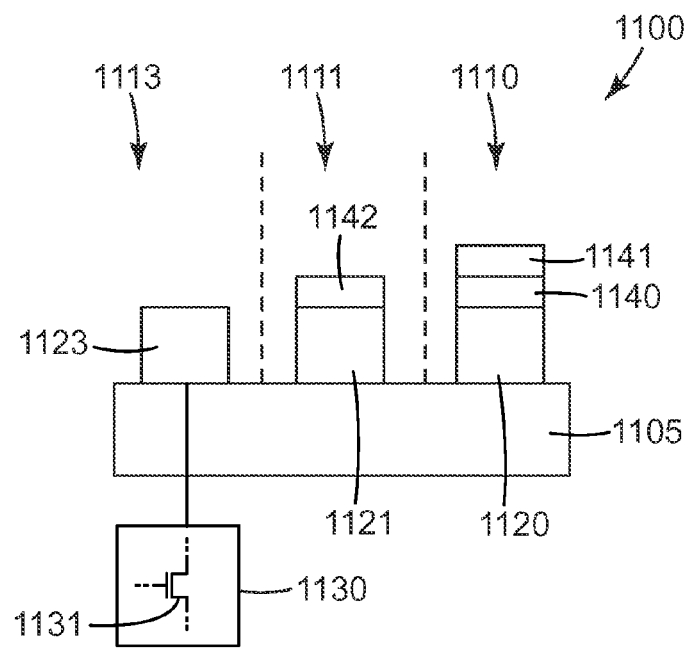
FIG. 11 is a schematic side-view of a light emitting system.

FIG. 11 is a schematic side-view of a light emitting system 1100 that includes an array of luminescent elements, such as luminescent elements 1110, 1111, and 1113, where each element is capable of independently outputting light. Each luminescent element includes an electroluminescent device that is capable of emitting light in response to an electric signal. For example, luminescent elements 1110, 1111, and 1113 include respective electroluminescent devices 1120, 1121, and 1123 disposed on a substrate 1105.

In some cases, the luminescent elements are configured as an active matrix, meaning that each luminescent element includes a dedicated switching circuit for driving the electroluminescent device(s) in the element. In such cases, a luminescent element includes any switching circuit(s) dedicated to the element. For example, luminescent element 1113 includes a dedicated switching circuit 1130 for driving electroluminescent device 1123, where the switching circuit includes a transistor 1131.

In some cases, the luminescent elements are configured as a passive matrix, meaning that the luminescent elements are not configured as an active matrix. In a passive matrix configuration, no luminescent element has a dedicated switching circuit for driving the electroluminescent device(s) in the luminescent element.

Typically, in a passive matrix configuration, the electroluminescent devices in the light emitting system are energized one row at a time. In contrast, in an active matrix configuration, although the rows are typically addressed one at a time, the switching circuits typically allow the electroluminescent devices to be energized continuously.

In some cases, at least some, for example all, of the electroluminescent devices in light emitting system 1100 are monolithically integrated. As used herein, monolithic integration includes, but is not necessarily limited to, two or more electronic devices that are manufactured on the same substrate (a common substrate) and used in an end application on that same substrate. Monolithically integrated devices that are transferred to another substrate as a unit remain monolithically integrated. Exemplary electronic devices include LEDs, transistors, and capacitors.

Where portions of each of two or more elements are monolithically integrated, the two elements are considered to be monolithically integrated. For example, two luminescent elements are monolithically integrated if, for example, the electroluminescent devices in the two elements are monolithically integrated. This is so, even if, for example, the light converting element in each element is adhesively bonded to the corresponding electroluminescent device.

In cases where the electroluminescent devices include semiconductor layers, the electroluminescent devices are monolithically integrated if the devices are manufactured on the same substrate and/or if they include a common semiconductor layer. For example, where each electroluminescent device includes an n-type semiconductor layer, the devices are monolithically integrated if the n-type semiconductor layer extends across the electroluminescent devices. In such a case, the n-type semiconductor layers in the electroluminescent devices form a continuous layer across the electroluminescent devices.

At least one luminescent element in light emitting system 1100 includes one or more light converting elements for converting light emitted by the electroluminescent device(s) in the luminescent element. For example, luminescent element 1110 includes light converting elements 1140 and 1141, and luminescent element 1111 includes light converting element 1142. In some cases, a light converting element can be or include a potential well or a quantum well.

As used herein, potential well means semiconductor layer(s) in a multilayer semiconductor structure designed to confine a carrier in one dimension only, where the semiconductor layer(s) has a lower conduction band energy than surrounding layers and/or a higher valence band energy than surrounding layers. Quantum well generally means a potential well which is sufficiently thin that quantization effects increase the energy for electron-hole pair recombination in the well. A quantum well typically has a thickness of about 100 nm or less, or about 10 nm or less.

Some luminescent elements in light emitting system 1100 do not include a light converting element. For example, luminescent element 1113 includes electroluminescent device 1123 but does not include a light converting element. In such cases, the light output of the luminescent element and the electroluminescent device in the luminescent element have the same wavelength or spectrum.

In the context of a display system, a luminescent element can be a pixel or a sub-pixel in the light emitting system. The pixelated light emitting system can emit light at different wavelengths, for example, in the visible region of the spectrum. For example, the electroluminescent devices in light emitting system 1100 can emit blue light. Light converting element 1140 can include a blue-to-green light converting potential well absorbing the blue light emitted by electroluminescent device 1120 and emitting green light. Light converting element 1141 can include a green-to-red light converting potential well absorbing the green light emitted by potential well 1140 and emitting red light. Light converting element 1142 can include a blue-to-green light converting potential well absorbing the blue light emitted by electroluminescent device 1121 and emitting green light. In such cases, luminescent elements 1110, 1111, and 1113 output red, green and blue lights, respectively.

Light emitting system 1100 can efficiently output light at any wavelength in, for example, the visible region of the spectrum. For example, light emitting system 1100 can efficiently emit green light since the blue emitting electroluminescent devices and blue-to-green light converting potential or quantum wells can be highly efficient. Improved efficiency can result in reduced power consumption in an optical system that incorporates a light emitting system similar to device 1100.

Light emitting system 1100 can be more compact than conventional light sources. Accordingly, optical systems utilizing light emitting system 1100 can be more compact, for example thinner, and have reduced weight.

In some applications, such as in a projection system or a backlight system, light emitting system 1100 can function as a light source for illuminating one or more image forming devices. The light emitting system can be designed to efficiently emit, for example, a primary color or white light. The improved efficiency and the compactness of light emitting system 1100 allows for improved and/or novel system designs. For example, portable battery-powered optical systems can be designed with reduced size, power consumption, and weight.

In some applications, such as in a projection system, light emitting system 1100 can function as a light source and an image forming device. In such applications, conventional image forming devices such as liquid crystal image forming devices (LCDs) or digital micro-mirror image forming devices (DMDs) can be eliminated from the projection system. Conventional projection systems include one or more relay optics for transferring light from light sources to image forming devices. The relay optics can be eliminated in a projection system that incorporates light emitting image forming device 1100, thereby reducing the number of elements, size, power consumption, weight and overall cost.

In general, the array of luminescent elements in light emitting system 1100 can be any type array desirable in an application. In some cases, the array can be a row or column, such as a 1×n array where n is 2 or greater. In some cases, the array can be a square array, such as an m×m array, or a rectangular array, such as an m×n array where n and m are both 2 or greater and m is different than n. In some cases, the array can be a trapezoidal array, a hexagonal array, or any other type array, such as any regular type or irregular type array.

In some cases, the luminescent elements in the array (or pixels in the array in the context of a display system) can be of equal size, or of different sizes, for example, to account for differences in efficiency of different colors.

A luminescent element in an array of luminescent elements can have any shape such as, square, oval, rectangular, or more complex shapes to accommodate, for example, optical and electrical functions of a device incorporating the array. The luminescent elements in an array can be placed in any arrangement that may be desirable in an application. For example, the elements can be uniformly spaced, for example, in a rectangular or hexagonal arrangement. In some cases, the elements may be placed non-uniformly, for example, to improve device performance by, for example, reducing or correcting optical aberrations such as pincushion or barrel distortions.

Figure 1:
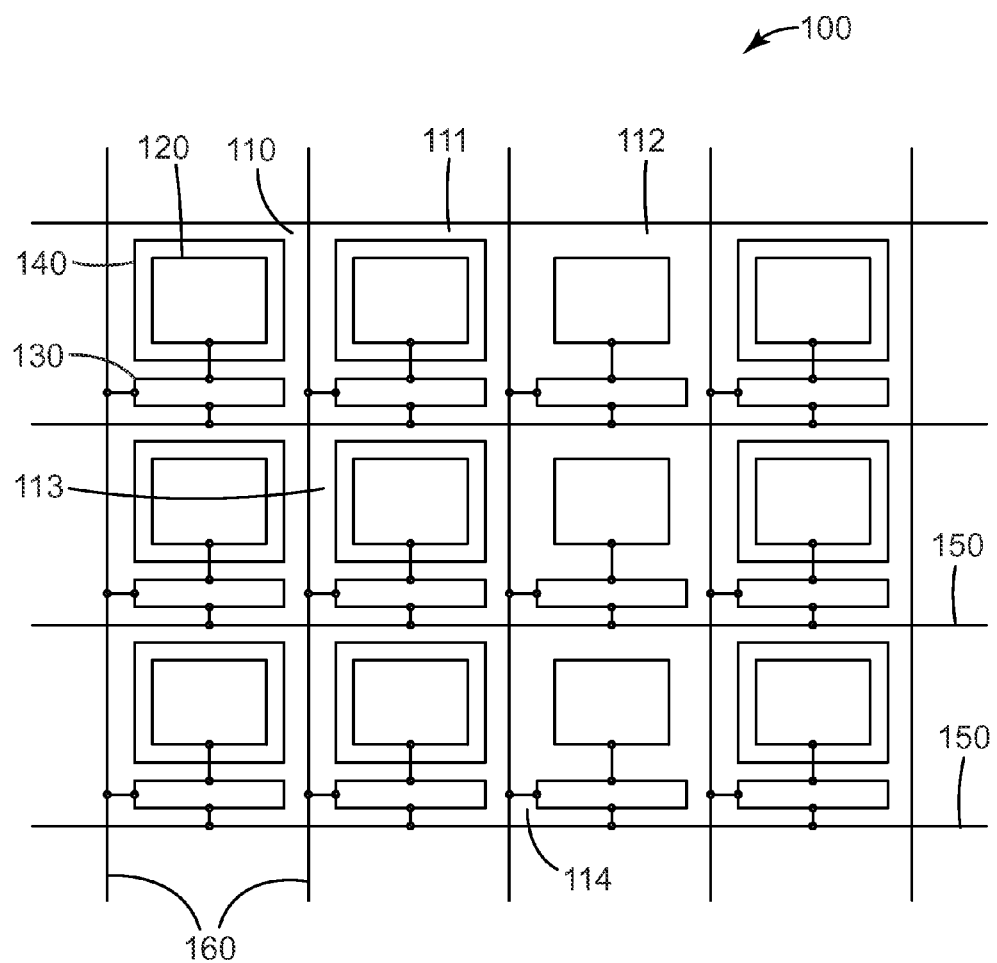
FIG. 1 is a schematic top-view of a light emitting system.

FIG. 1 is a schematic top-view of a light emitting system 100 that includes two or more luminescent elements, such as luminescent elements 110-114. Each luminescent element includes an electroluminescent device that when electrically driven, is capable of emitting light. Each luminescent element further includes a switching circuit for driving the electroluminescent device in the luminescent element. For example, luminescent element 110 includes an electroluminescent device 120 and a switching circuit 130 for driving electroluminescent device 120. In some cases, a luminescent element may include more than one electroluminescent device.

At least one luminescent element in light emitting system 100 includes one or more light converting elements (LCE) for converting light emitted by the electroluminescent device in the luminescent element. For example, luminescent element 110 includes a light converting element 140 capable of converting, such as down converting, light that is emitted by electroluminescent device 120. As another example, luminescent element 112 does not include a light converting element.

Light converting element 140 can include any element capable of receiving light at a first wavelength and converting at least a portion of the received light to light at a second wavelength different than the first wavelength. For example, light converting element 140 can include a phosphor, a fluorescent dye, a conjugated light emitting organic material such as a polyfluorene, a potential well, a quantum well, or a quantum dot. Exemplary phosphors that may be used as a light converting element include strontium thiogallates, doped GaN, copper-activated zinc sulfide, and silver-activated zinc sulfide.

Inorganic potential and quantum wells, such as inorganic semiconductor potential and quantum wells, typically have increased light conversion efficiencies and are more reliable by being less susceptible to environmental elements such as moisture. Furthermore, inorganic potential and quantum wells tend to have narrower output spectrum resulting in, for example, improved color gamut.

Electroluminescent device 120 is capable of emitting light in the presence of an electric signal. For example, in some cases, electroluminescent device 120 can emit light when a strong electric field is applied across the device. As another example, electroluminescent device 120 can emit light in response to an electric current passing through the device.

In some cases, electroluminescent device 120 can include a phosphorescent material capable of emitting light when absorbing electrical energy. In some cases, electroluminescent device 120 can include a semiconductor electroluminescent device such as a light emitting diode (LED) or a laser diode.

Light emitting system 100 further includes row enable electrodes 150 and column data electrodes 160 for applying electric signals from an external circuit not shown in FIG. 1 to the switching circuits. In some cases, row enable electrodes 150 are disposed along the rows of the light emitting system for selectively addressing the rows of the light emitting system and column data electrodes 160 are disposed along the columns of the light emitting system for selectively addressing the columns of the light emitting system. In some cases, row enable electrodes 150 and column data electrodes 160 are connected to respective row and column driver circuits not explicitly shown in FIG. 1.

An electroluminescent device in light emitting system 100 can be any device capable of emitting light in response to an electrical signal. For example, an electroluminescent device can be a light emitting diode (LED) capable of emitting photons in response to an electrical current as discussed in, for example, U.S. Patent Publication No. 2006/0124917, entitled "Adapting Short-Wavelength LED's for Polychromatic, Broadband, or 'White' Emission", incorporated herein by reference in its entirety.

An LED electroluminescent device can emit light at any wavelength that may be desirable in an application. For example, the LED can emit light at a UV wavelength, a visible wavelength, or an IR wavelength. In some cases, the LED can be a short-wavelength LED capable of emitting UV photons. In general, the LED and/or a light converting element (LCE) may be composed of any suitable materials, such as organic semiconductors or inorganic semiconductors, including Group IV elements such as Si or Ge; III-V compounds such as InAs, AlAs, GaAs, InP, AlP, GaP, InSb, AlSb, GaSb, GaN, AlN, InN and alloys of III-V compounds such as AlGaInP and AlGaInN; II-VI compounds such as ZnSe, CdSe, BeSe, MgSe, ZnTe, CdTe, BeTe, MgTe, ZnS, CdS, BeS, MgS and alloys of II-VI compounds, or alloys of any of the compounds listed above.

In some cases, the LED can include one or more p-type and/or n-type semiconductor layers, one or more active layers that may include one or more potential and/or quantum wells, buffer layers, substrate layers, and superstate layers.

In some cases, the LED and/or the LCE can include CdMgZnSe alloys having compounds ZnSe, CdSe, and MgSe as the three constituents of the alloy. In some cases, one or more of Cd, Mg, and Zn, especially Mg, may have zero concentration in the alloy and therefore, may be absent from the alloy. For example, the LCE can include a $Cd_{0.70}Zn_{0.30}Se$ quantum well capable of emitting in the red, or a $Cd_{0.33}Zn_{0.67}Se$ quantum well capable of emitting in the green. As another example, the LED and/or the LCE can include an alloy of Cd, Zn, Se, and optionally Mg, in which case, the alloy system can be represented by Cd(Mg)ZnSe. As another example, the LED and/or the LCE can include an alloy of Cd, Mg, Se, and optionally Zn. In some cases, a quantum well LCE has a thickness in a range from about 1 nm to about 100 nm, or from about 2 nm to about 35 nm.

In some cases, a semiconductor LED or LCE may be n-doped or p-doped where the doping can be accomplished by any suitable method and by inclusion of any suitable dopant. In some cases, the LED and the LCE are from the same semiconductor group. In some cases, the LED and the LCE are from two different semiconductor groups. For example, in some cases, the LED is a III-V semiconductor device and the LCE is a II-VI semiconductor device. In some cases, the LEDs include AlGaInN semiconductor alloys and the LCEs include Cd(Mg)ZnSe semiconductor alloys.

An LCE can be disposed on or attached to a corresponding electroluminescent device by any suitable method such as by an adhesive such as a hot melt adhesive, welding, pressure, heat or any combinations of such methods. Examples of suitable hot melt adhesives include semicrystalline polyolefins, thermoplastic polyesters, and acrylic resins.

In some cases, an LCE can be attached to a corresponding electroluminescent device by a wafer bonding technique. For example, the uppermost surface of the electroluminescent device and the lowermost surface of the LCE can be coated with a thin layer of silica or other inorganic materials using, for example, a plasma assisted or conventional CVD process. Next, the coated surfaces can be optionally planarized and bonded using a combination of heat, pressure, water, or one or more chemical agents. The bonding can be improved by bombarding at least one of the coated surfaces with hydrogen atoms or by activating the surface using a low energy plasma. Wafer bonding methods are described in, for example, U.S. Pat. Nos. 5,915,193 and 6,563,133, and in chapters 4 and 10 of "Semiconductor Wafer Bonding" by Q. Y. Tong and U. Gösele (John Wiley & Sons, New York, 1999).

In some cases, a quantum or potential well LCE can have one or more light absorbing layers proximate the well to assist in absorbing light emitted from a corresponding electroluminescent device. In some cases, the absorbing layers are composed of materials in which photogenerated carriers can efficiently diffuse to the potential well. In some cases, the light absorbing layers can include a semiconductor, such as an inorganic semiconductor. In some cases, a quantum or potential well LCE can include buffer layers, substrate layers, and superstrate layers.

An electroluminescent device or an LCE can be manufactured by any suitable method. For example, a semiconductor electroluminescent device and/or LCE can be manufactured using molecular beam epitaxy (MBE), chemical vapor deposition (CVD), liquid phase epitaxy (LPE) or vapor phase epitaxy (VPE).

Light emitting system 100 enables direct creation of images at very small sizes where the brightness of each luminescent element or pixel can be independently controlled. Alternatively, the light emitting system can be used for "zone illumination" of image forming devices, thereby allowing for reduced power consumption by darkening or reducing the brightness of emitting system pixel(s) that correspond to a dark area of an ultimate image. The ability to provide a highly controllable lighting source provides a large advantage in conserving energy as well as minimizing the size of the optical systems, such as projection systems, that utilize the light emitting system.

Figure 2:
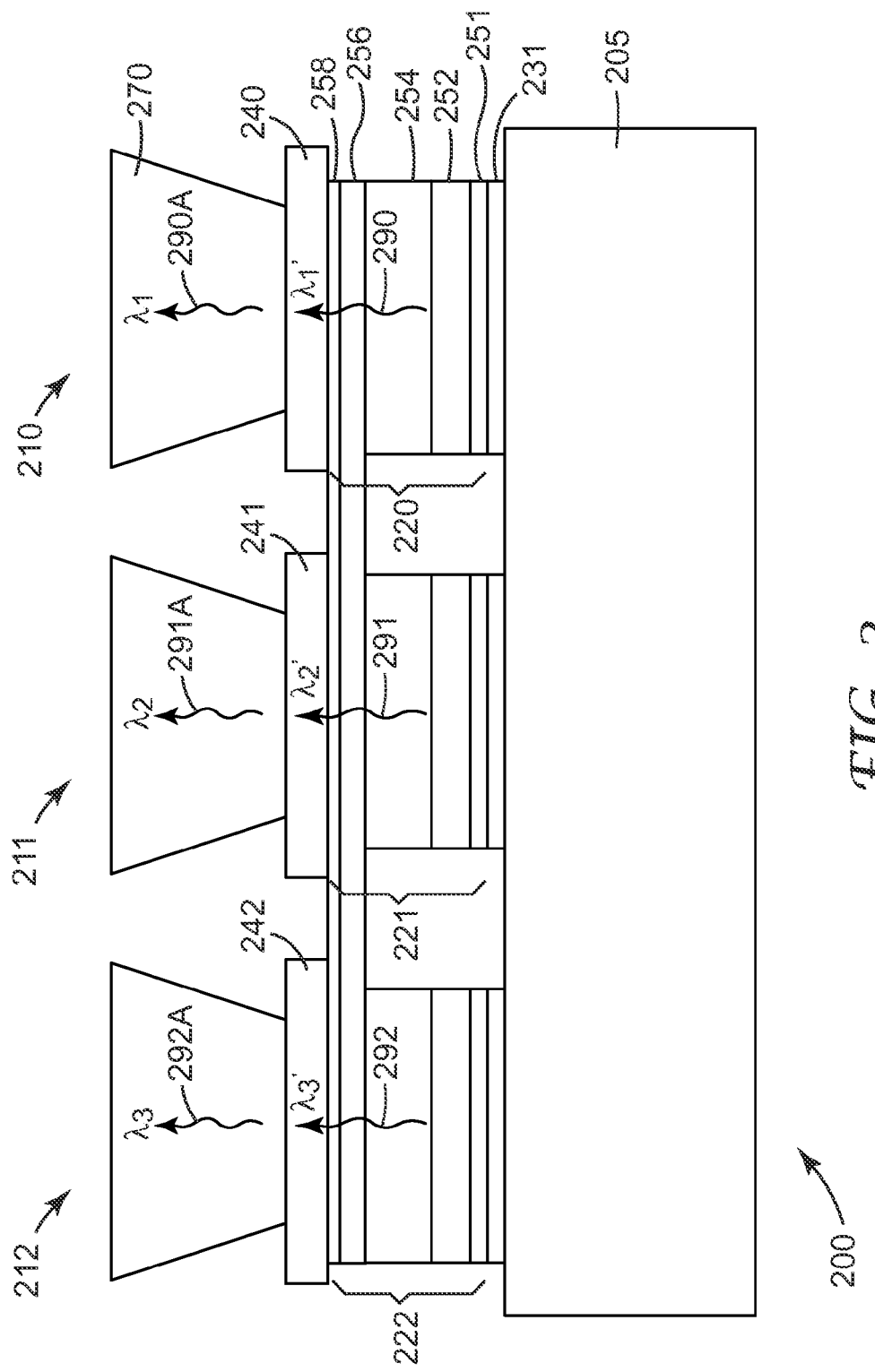
FIG. 2 is a schematic side-view of a light emitting system.

FIG. 2 is a schematic side-view of a light emitting system 200 that includes an array of luminescent elements, such as luminescent elements 210-212, disposed on a common substrate 205. Each luminescent element includes an electroluminescent device and a switching circuit for driving the electroluminescent device. For example, luminescent element 210 includes an electroluminescent device 220 and a switching circuit 231 for driving electroluminescent device 220, where the switching circuit can include one or more transistors. Electroluminescent device 220 includes a first electrode 251, a p-type semiconductor layer 252, an optional semiconductor active layer 254, an n-type semiconductor layer 256, and an optional second electrode 258.

Electrode 251 is designed to provide ohmic contact with and spread electrical current through p-type layer 252. Optional active layer 254 is typically a semiconductor layer, typically a multiple-quantum-well layer, for radiative recombination of electron-hole pairs injected from p-type layer 252 and n-type layer 256.

In some cases, such as when n-type layer 256 is sufficiently conductive to adequately spread an electrical current flowing through the n-type layer, second electrode 258 may be formed, for example, at a periphery of the electroluminescent device or the light emitting system.

In the exemplary light emitting system 200, n-type layer 256 extends across luminescent elements 210-212, meaning that n-type layer 256 forms a continuous layer across luminescent elements 210-212. In general, a semiconductor layer in a luminescent element may or may not extend across other luminescent elements. For example, in some cases, each luminescent element can have a discrete n-type layer 256.

Luminescent element 210 further includes a light converting element for converting light emitted by electroluminescent device 220. In general, at least one luminescent element in light emitting system 200 includes a light converting element, such as a potential well or a quantum well, for converting, such as down converting, light emitted by the electroluminescent device in the luminescent element. In some cases, each luminescent element in light emitting system 200 includes a light converting element.

In the exemplary light emitting system 200, luminescent element 210 includes a light converting element 240 disposed on electroluminescent device 220, luminescent element 211 includes a light converting element 241 disposed on an electroluminescent device 221, and luminescent element 212 includes a light converting element 242 disposed on an electroluminescent device 222.

In some cases, luminescent element 210 is capable of outputting light 290A at a first wavelength $\lambda_1$, luminescent element 211 is capable of outputting light 291A at a second wavelength $\lambda_2$, and luminescent element 212 is capable of outputting light 292A at a third wavelength $\lambda_3$. In some cases, wavelength $\lambda_2$ is different from $\lambda_1$ and wavelength $\lambda_3$ is different from $\lambda_1$ and $\lambda_2$.

In some cases, electroluminescent device 220 is capable of emitting light 290 at $\lambda_1'$, electroluminescent device 221 is capable of emitting light 291 at $\lambda_2'$, and electroluminescent device 222 is capable of emitting light 292 at $\lambda_3'$. In some cases, wavelength $\lambda_2'$ is different from $\lambda_1'$ and wavelength $\lambda_3'$ is different from $\lambda_1'$ and $\lambda_2'$. In some cases, wavelength $\lambda_1'$ is different from wavelength $\lambda_1$, wavelength $\lambda_2'$ is different from wavelength $\lambda_2$, and wavelength $\lambda_3'$ is different from wavelength $\lambda_3$. In such cases, light converting element 240 converts at least a portion of light 290 at wavelength $\lambda_1'$ to light 290A at wavelength $\lambda_1$, light converting element 241 converts at least a portion of light 291 at wavelength $\lambda_2'$ to light 291A at wavelength $\lambda_2$, and light converting element 242 converts at least a portion of light 292 at wavelength $\lambda_3'$ to light 292A at wavelength $\lambda_3$.

In some cases, the light outputted by luminescent element 210 may simply be the light emitted by electroluminescent device 220. In such cases, wavelengths $\lambda_1$ and $\lambda_1'$ are substantially the same. In such cases, LCE 240 is eliminated from electroluminescent element 210 and may, for example, be replaced with an equally thick transparent element, for example, to assist in planarizing the light emitting system.

In general, light converting element 240 can be any element capable of converting at least a portion of light from a first wavelength to a second wavelength different from the first wavelength. In some cases, light converting element 240 can be a photoluminescent element capable of converting light by absorption and photoluminescence. In some cases, a photoluminescent element can include one or more potential and/or quantum wells.

In some cases, the light converting element can include a potential well. In general, the potential well can have any conduction and/or valence band profile. Some exemplary conduction band profiles for a potential well are shown schematically in FIGS. 14A-14F where $E_C$ denotes the conduction band energy. In particular, a potential well 1410 shown in FIG. 14A has a square or rectangular profile; a potential well 1420 shown in FIG. 14B has a first rectangular profile 1421 combined with a second rectangular profile 1422 and a third rectangular profile 1423; a potential well 1430 shown in FIG. 14C has a linearly graded profile; a potential well 1440 shown in FIG. 14D has a linearly graded profile 1441 combined with a rectangular profile 1442; a potential well 1450 shown in FIG. 14E has a curved, such as a parabolic, profile; and a potential well 1460 shown in FIG. 14F has a parabolic profile 1461 combined with a rectangular profile 1462.

Referring back to FIG. 2, in some cases, wavelengths $\lambda_1'$, $\lambda_2'$, and $\lambda_3'$ may be in the same region of the spectrum, such as the blue, violet, or UV region of the spectrum. In some cases, wavelengths $\lambda_1'$, $\lambda_2'$, and $\lambda_3'$ may be substantially the same. For example, wavelengths $\lambda_1'$, $\lambda_2'$, and $\lambda_3'$ may be substantially the same wavelength in the blue, violet, or UV region of the spectrum.

In some cases, $\lambda_1'$, $\lambda_2'$, and $\lambda_3'$ are substantially the same wavelength, wavelength $\lambda_1$ is substantially the same as $\lambda_1'$, wavelength $\lambda_2$ is different from $\lambda_2'$, and wavelength $\lambda_3$ is different from $\lambda_3'$. For example, wavelengths $\lambda_1$, $\lambda_1'$, $\lambda_2'$, and $\lambda_3'$ can all be about 460 nm (blue), $\lambda_2$ can be about 540 nm (green), and $\lambda_3$ can be about 630 nm (red).

In some cases, $\lambda_1$, $\lambda_1'$, $\lambda_2'$, and $\lambda_3'$ are in the same first region of the spectrum, such as the blue region of the spectrum; wavelength $\lambda_2$ is in a second region of the spectrum different from the first region, such as the green region of the spectrum; and wavelength $\lambda_3$ is in a third region of the spectrum different from the first and second regions, such as the red region of the spectrum.

Figure 3:
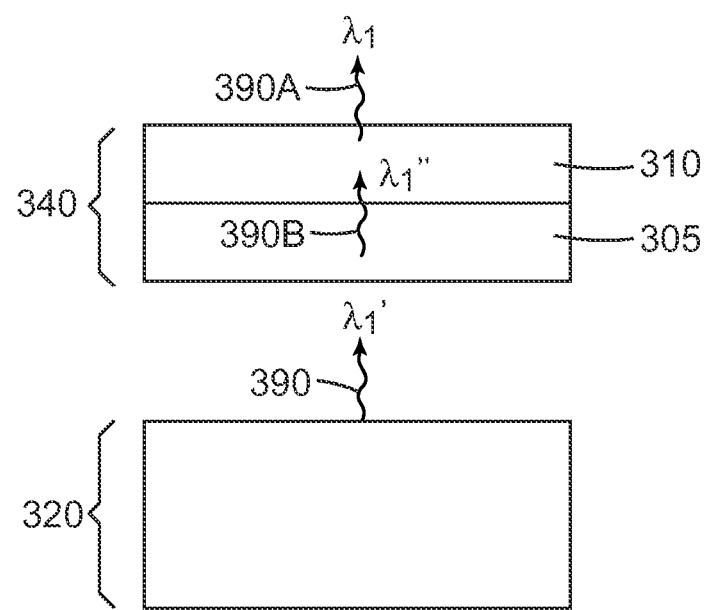
FIG. 3 is a schematic side-view of a light converting element and an electroluminescent device.

In some cases, light converting element 240 may convert light at wavelength $\lambda_1'$ to light at wavelength $\lambda_1$ by first converting light at wavelength $\lambda_1'$ to a third wavelength. For example, FIG. 3 is a schematic side-view of a light converting element 340 that includes a first photoluminescent element 305 and a second photoluminescent element 310. Photoluminescent element 305 receives light 390 at wavelength $\lambda_1'$ from an electroluminescent device 320 similar to device 220, and converts at least a portion of light 390 to light 390B at wavelength $\lambda_1''$. Second photoluminescent element 310 converts at least a portion of light 390B to light 390A at wavelength $\lambda_1$.

In some cases, electroluminescent device 320 may be capable of emitting light in the blue region of the spectrum, photoluminescent element 305 may convert a portion of the blue light to light in the green region of the spectrum, and photoluminescent element 310 may convert a portion of the green light exiting element 305 to light in the red region of the spectrum.

In some cases, each photoluminescent layer converts only a portion of light it receives and transmits the rest. For example, electroluminescent device 320 may emit blue light, photoluminescent element 305 may convert a portion of the blue light to green light and transmit the rest of the blue light, and photoluminescent element 310 may convert a portion of the green and/or blue light to red light and transmit the rest of the blue and green light it receives from photoluminescent element 305. In such cases, light outputted by photoluminescent element 310 may be substantially white light.

In some cases, different luminescent elements in light emitting system 200 of FIG. 2 may output light at more than three different regions in the visible spectrum. For example, the luminescent elements may output light at five different regions in the visible spectrum, for example, to improve color properties of the overall light outputted by the light emitting system. For example, some luminescent elements may output blue light; some luminescent elements may output cyan light, for example, at about 500 nm; some luminescent elements may output green light; some luminescent elements may output yellow or orange light; and some luminescent elements may output red light.

In some cases, a cyan output light can be achieved by using a potential well capable of re-emitting cyan light, or by combining the output of two potential wells where the first potential well is capable of re-emitting, for example, at about 460 nm and the second potential well is capable of re-emitting, for example, at about 540 nm.

In some cases, a magenta output light can be achieved by combining the output of two potential wells where the first potential well is capable of re-emitting, for example, at about 460 nm and the second potential well is capable of re-emitting, for example, at about 630 nm.

Luminescent element 210 in FIG. 2 further includes a light extractor 270 for extracting light from one or layers, such as layer 240, disposed below the light extractor. In general, light can be extracted by any means suitable in an application. For example, light can be extracted by encapsulation where the encapsulating element can, for example, have a hemispherical profile for partially collimating the extracted light. Light can also be extracted by patterning or texturing, for example roughening, the top and/or lower surfaces of one or more layers in the luminescent element. As another example, light can be extracted by forming a photonic crystal on the exterior surface of a light converting element and/or an electroluminescent device and/or other layers in the luminescent element. Exemplary photonic crystals are described in, for example, U.S. Pat. Nos. 6,987,288 and 7,161,188. In some cases, light can be extracted by forming an optical element, such as light extractor 270, on the output surface. Light extractor 270 can be any element and can have any shape capable of extracting at least a portion of light that would otherwise not exit the luminescent element due to, for example, total internal reflection. Exemplary light extractors are described in, for example, commonly-owned U.S. Provisional Patent Application No. 60/804,824, titled "LED Device with Re-emitting Semiconductor Construction and Optical Element", having, filed on Jun. 14, 2006; commonly-owned U.S. Provisional Patent Application No. 60/866,265, titled "Planarized LED with Optical Extractor", having, filed on Nov. 17, 2006; and commonly-owned U.S. Provisional Patent Application No. 60/804,544, titled "LED Device with Re-emitting Semiconductor Construction and Converging Optical Element", having, filed on Jun. 12, 2006, the entirety of which are incorporated herein by reference.

In some cases, a luminescent element can have a dedicated light extractor. In some cases, a light extractor may extend beyond a luminescent element. For example, in some cases, a light extractor may extend across two or more luminescent elements.

In general, light extractor 270 is optically transparent and, in some cases, has a relatively high refractive index. Exemplary materials for the extractor include inorganic materials such as high index glasses (e.g., Schott glass type LASF35, available from Schott North America, Inc., Elmsford, N.Y. under a trade name LASF35) and ceramics (e.g., sapphire, zinc oxide, zirconia, diamond, and silicon carbide). Exemplary useful glasses are described in commonly assigned U.S. patent application Ser. No. 11/381,518 entitled "LED Extractor Composed Of High Index Glass" incorporated herein by reference. Sapphire, zinc oxide, diamond, and silicon carbide are particularly useful ceramic materials since these materials also have a relatively high thermal conductivity (0.2-5.0 W/cm K). In some cases, light extractor 270 includes high index polymers or nano-particle filled polymers, where the polymers can be, for example, thermoplastic and/or thermosetting. In some cases, thermoplastic polymers can include polycarbonate and cyclic olefin copolymers. In some cases, thermosetting polymers can be, for example, acrylics, epoxy, silicones, or others known in the art. Exemplary ceramic nano-particles include zirconia, titania, zinc oxide, and zinc sulfide.

Extractor 270 can be manufactured by conventional techniques, such as machining or molding, or by using precision abrasive techniques disclosed in commonly assigned U.S. Patent Publication No. 2006/0094340A1, entitled "Process For Manufacturing Optical And Semiconductor Elements"; U.S. Patent Publication No. 2006/0094322A1, entitled "Process For Manufacturing A Light Emitting Array"; and U.S. patent application Ser. No. 11/288,071, entitled "Arrays Of Optical Elements And Method Of Manufacturing Same" the entirety of which are incorporated herein by reference. Other exemplary manufacturing techniques are described in commonly assigned U.S. patent application Ser. No. 11/381,512, entitled "Methods Of Making LED Extractor Arrays" incorporated herein by reference.

In some cases, the luminescent elements in light emitting system 200 of FIG. 2 are configured as an active matrix array. In such cases, each luminescent element in the light emitting system includes a dedicated switching circuit for driving the electroluminescent device within the luminescent element. For example, luminescent element 210 includes switching circuit 231 that may include one or more transistors not shown in FIG. 2.

In some cases, the luminescent elements in light emitting system 200 are configured as a passive matrix array. In such cases, no luminescent element in the light emitting system has a dedicated switching circuit. In some cases, the p-type electrodes are connected to form rows and the n-type electrodes are connected to form columns.

Substrate 205 can include any material that may be suitable in an application. For example, substrate 205 may include or be made of Si, Ge, GaAs, GaN, InP, sapphire, SiC and ZnSe. In some cases, substrate 205 may be n-doped, p-doped, insulating, or semi-insulating, where the doping may be achieved by any suitable method and/or by inclusion of any suitable dopant.

In some cases, light emitting system 200 does not include a substrate 205. For example, various elements of light emitting system 200 may be formed on substrate 205 and then separated from the substrate by, for example, etching or ablation.

Figure 4:
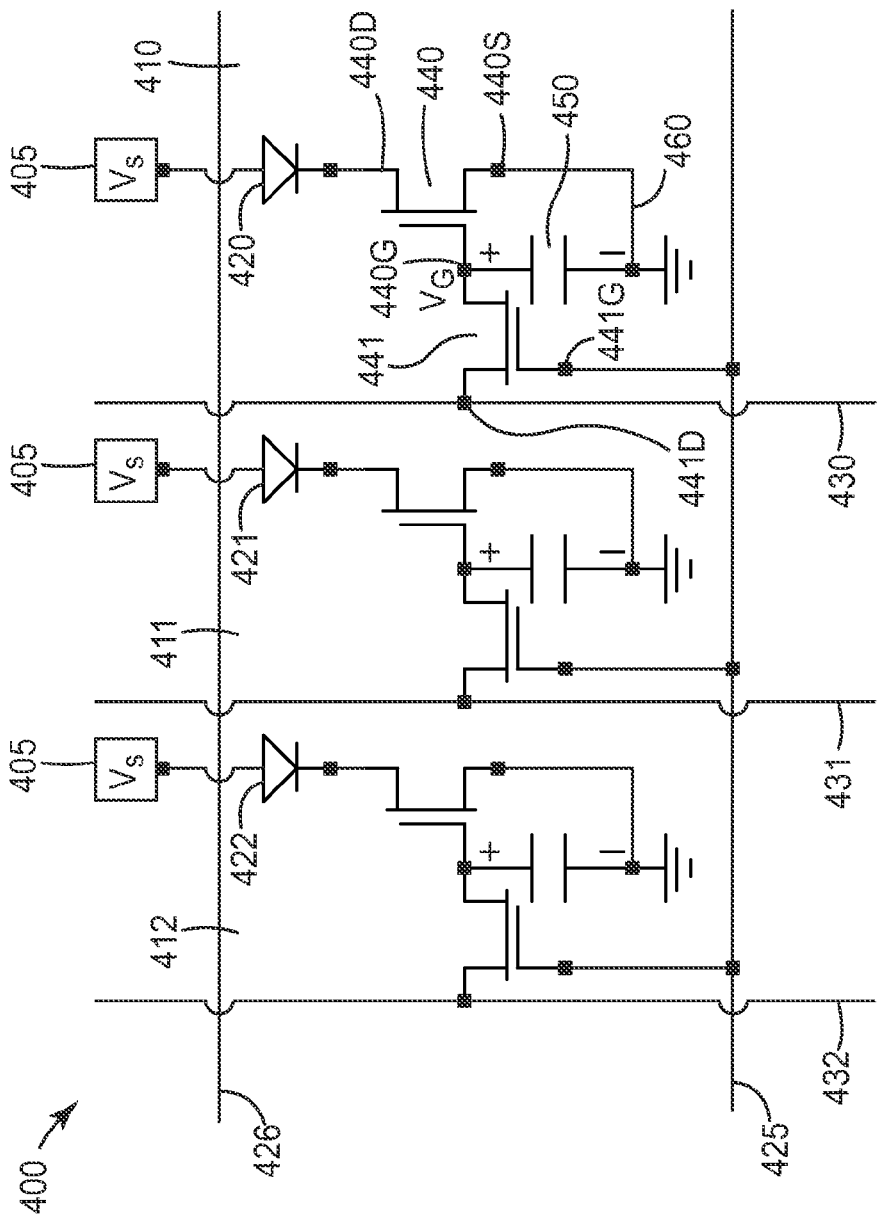
FIG. 4 is a schematic view of a circuit diagram.

FIG. 4 is a schematic circuit diagram of three luminescent elements 410-412, similar to luminescent elements 210-212, in a light emitting system 400, similar to light emitting system 200, where the luminescent elements are configured as an active matrix array. Light emitting system 400 further includes row enable lines 425 and 426 and column data lines 430-432. Each luminescent element includes a dedicated switching circuit for driving the electroluminescent device within the luminescent element. For example, luminescent element 410 includes a switching circuit 460, similar to switching circuit 231, that includes transistors 440 and 441 and capacitor 450. Each luminescent element further includes an electroluminescent device, similar to electroluminescent device 220, identified by a diode symbol in FIG. 4. In particular, luminescent element 410 includes an electroluminescent device 420 that is connected to a power supply source 405 capable of applying a voltage $V_s$ to electroluminescent device 420, luminescent element 411 includes an electroluminescent device 421 that is connected to power supply source 405, and luminescent element 412 includes an electroluminescent device 422 that is connected to power supply source 405.

Transistor 440 includes a gate electrode 440G, a source electrode 440S connected to a ground, and a drain electrode 440D connected to electroluminescent device 420. Transistor 441 includes a gate electrode 441G connected to row enable line 425, a drain electrode 441D connected to column data line 430, and a source electrode connected to the gate electrode of transistor 440.

Transistor 441 is primarily designed as a switch transistor for controlling the voltage $V_G$ at gate 440G of transistor 440. Voltage $V_G$ is also the voltage across capacitor 450. Capacitor 450 is primarily designed to maintain the voltage $V_G$ at the gate of transistor 440 even when transistor 441 is off due to, for example, a sufficiently low signal applied to gate 441G by row enable line 425.

Transistor 440 is primarily designed as a drive transistor for controlling current flow through electroluminescent device 420. The current flow through electroluminescent device 420 can control the intensity of light emitted by the device.

In some cases, light emitting system 400 can be a display device capable of forming an image in a plane of the device. In such cases, each electroluminescent element can be a pixel in the display device. In some cases, electroluminescent elements 410-412 can be three sub-pixels in a pixel. For example, electroluminescent element 410 can be a red sub-pixel capable of outputting red light, electroluminescent element 411 can be a green sub-pixel capable of outputting green light, and electroluminescent element 412 can be a blue sub-pixel capable of outputting blue light where, in some cases, the combination of the three outputted lights can result in white or other color light.

Figure 5:
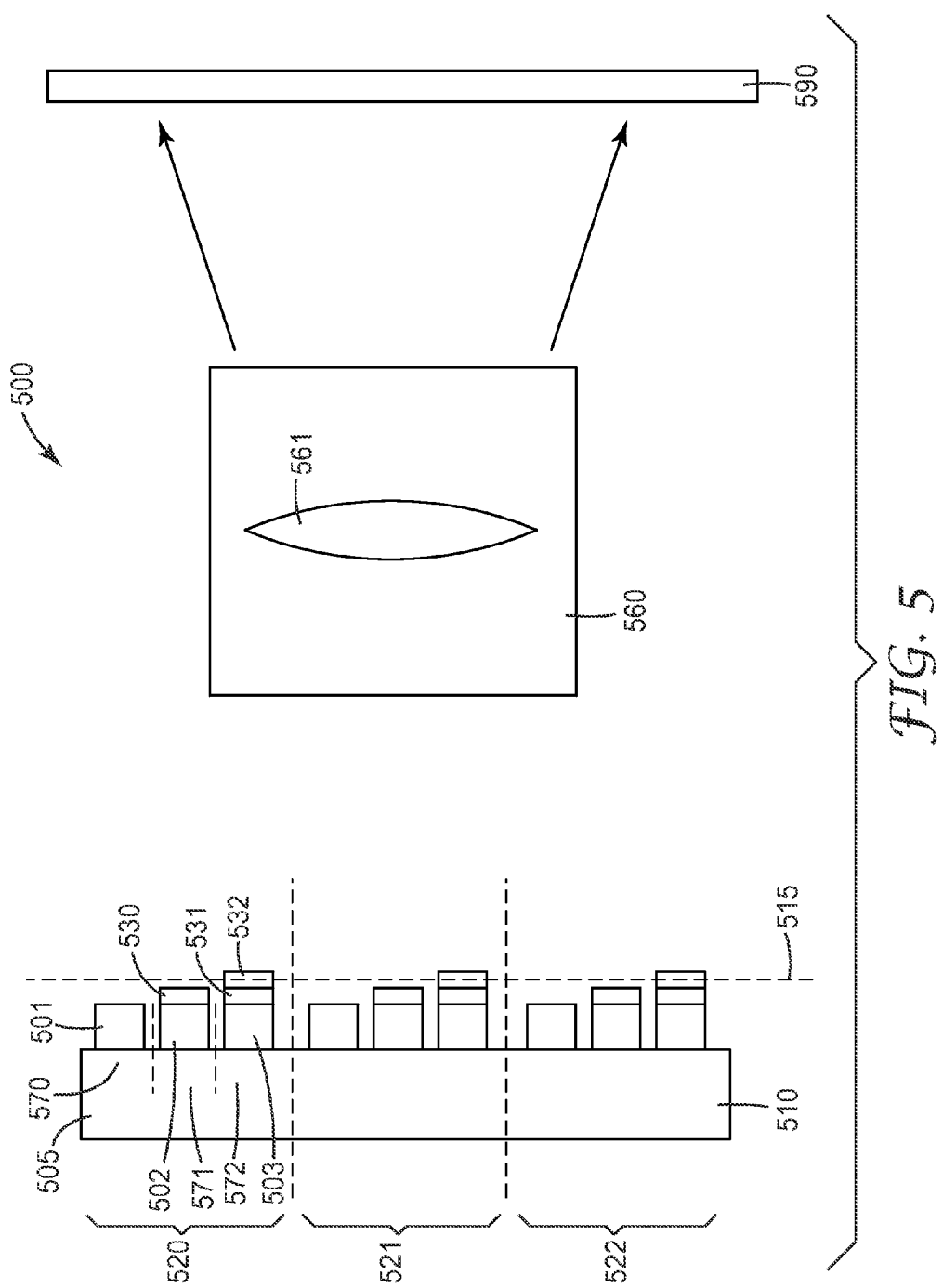
FIG. 5 is a schematic side-view of a projection system.

FIG. 5 is a schematic side-view of a projection system 500 that includes a light emitting system 510, projection optics 560, and an optional projection screen 590. Light emitting system 510 is similar to light emitting system 200, is capable of emitting light and forming an image in a plane 515 of the emitting system, and is pixelated and includes a plurality of pixels such as pixels 520-522. Each pixel is capable of outputting white light and includes three sub-pixels where each sub-pixel is capable of outputting a different primary color light. For example, pixel 520 includes three sub-pixels 570-572 where each sub-pixel includes an electroluminescent device. In particular, sub-pixel 570 includes an electroluminescent device 501, sub-pixel 571 includes an electroluminescent device 502, and sub-pixel 572 includes an electroluminescent device 503, where electroluminescent devices 501-503 can be monolithically integrated, for example, on a substrate 505. Each sub-pixel includes a dedicated switching circuit, not shown in FIG. 5 for ease of illustration, for driving the electroluminescent device in the sub-pixel.

In some cases, light emitted from each pixel in light emitting system 510 has substantially the same emission spectrum. In some cases, the pixels in light emitting system 510 are configured as an active matrix. In some other cases, the pixels in light emitting system 510 are configured as a passive matrix. In some cases, all the electroluminescent devices in light emitting system 510 are capable of emitting the same color, for example blue, light. In some cases, sub-pixel 570 includes no light converting elements and is capable of outputting blue light, sub-pixel 571 includes a light converting element 530, that can include a potential or quantum well, for converting blue light to green light resulting in the sub-pixel being capable of outputting green light, and sub-pixel 572 includes a first light converting element 531 for converting blue light to green light and a second light converting element 532 for converting green light to red light resulting in sub-pixel 572 being capable of outputting red light. In some cases, one or more or all of the light converting elements in the light emitting system can be or include potential wells or quantum wells.

Projection optics 560 magnifies an image formed by light emitting system 510 and projects the magnified image onto a projection screen 590 for viewing by a viewing audience. In some cases, the projected image may be a virtual image in which case the projection system may not require a projection screen. Projection optics 560 typically includes one or more optical lenses, such as lens 561.

In some cases, projection system 500 may be a rear projection system, in which case, projection screen 590 is preferably a rear projection screen. In some cases, projection system 500 may be a front projection system, in which case, projection screen 590 is preferably a front projection screen.

Light emitting system 510 functions as a light source in projection system 500. Light emitting system 510 also functions as an image forming device in the projection system. Projection system 500 can be considered an emissive projection system because an image is directly produced by modulating light emitting system 510.

The exemplary projection system 500 includes one light emitting system. In general, projection system 500 can include one or more light emitting systems. For example, the projection system can have three light emitting systems each capable of forming the same image in a different primary color. In such cases, projection optics 560 can combine the three images and magnify and project the combined image onto projection screen 590.

Figure 6:
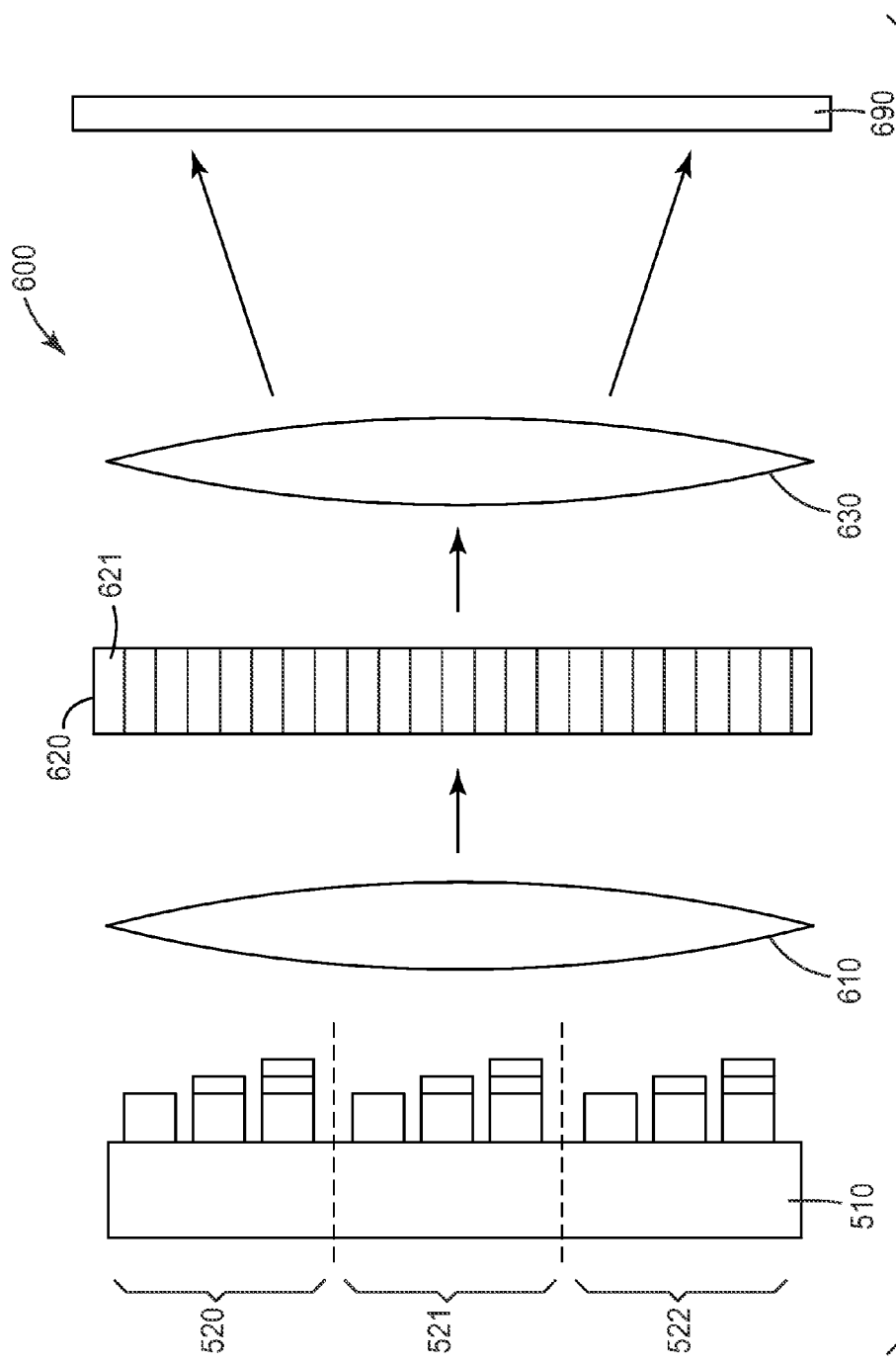
FIG. 6 is a schematic side-view of another projection system.

FIG. 6 is a schematic side-view of a projection system 600 that includes light emitting system 510, relay optics 610, a pixelated spatial light modulator (SLM) 620 for receiving light from system 510 and having a plurality of pixels such as pixel 621, projection optics 630, and an optional projection screen 690. SLM 620 can be any conventional image forming device such as a liquid crystal image forming device (LCD) or a digital micro-mirror image forming device (DMD). Light emitting system 510 functions as a light source in the projection system. Relay optics 610 directs light emitted by light emitting system 510 towards the spatial light modulator for illumination of the SLM. In some cases, each pixel in light emitting system 510 is capable of outputting white light and can include, for example, three sub-pixels where each sub-pixel is capable of outputting a different primary color light.

Projection optics 630 magnifies an image formed by SLM 620 and projects the magnified image onto projection screen 690 for viewing by a viewing audience. In some cases, the projected image may be a virtual image in which case the projection system may not require a projection screen. Projection optics 630 typically includes one or more optical lenses. Projection system 600 can be considered a passive projection system because a spatial light modulator is used to form an image.

In some cases, projection system 600 may be a rear projection system, in which case, projection screen 690 is preferably a rear projection screen. In some cases, projection system 600 may be a front projection system, in which case, projection screen 690 is preferably a front projection screen.

The exemplary projection system 600 includes one light emitting system and one SLM. In general, projection system 600 can include one or more light emitting systems and one or more SLMs. For example, the projection system can have three SLMs and one light emitting system. In such cases, white light from the light emitting system can be broken down into three primary colors. Each SLM is illuminated by a different primary color. The three images formed by the three SLMs are combined by, for example, an optical combiner. The resulting image is magnified and projected by projection optics 630 onto projection screen 690.

Figure 7:
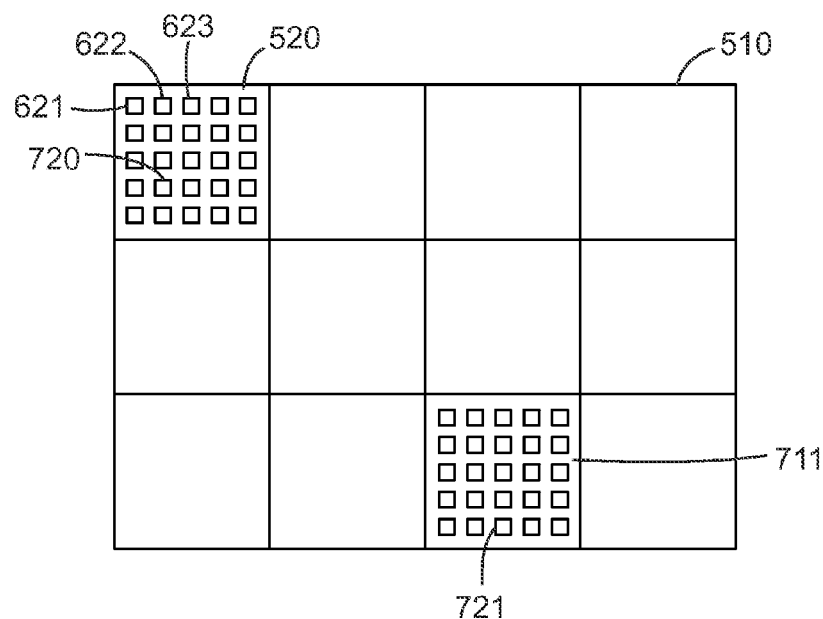
FIG. 7 is a schematic representation of a correspondence between the pixels of a light emitting system an a spatial light modulator.

In some cases, light emitting system 510 has fewer pixels than spatial light modulator 620. In some cases, a pixel in light emitting system 510 may correspond to a group of pixels in SLM 620, meaning that the light emitting system pixel's illumination of the SLM is substantially limited to the corresponding group of pixels in the SLM. FIG. 7 shows an exemplary correspondence between the pixels of light emitting system 510 and SLM 620. In particular, a first group of pixels 720 of SLM 620, including pixels 621-623, correspond to pixel 520 of the light emitting system and a second group of pixels 721 of the SLM correspond to a pixel 711 of the light emitting system. In some cases, each pixel in light emitting system 510 illuminates a different subset of pixels in SLM 620. In such cases, each pixel in light emitting system 510 corresponds to a different subset of pixels in SLM 620. In some cases, there is substantially no pixel overlap between these subsets in SLM 620. In such cases, at least one pixel in SLM 620 receives light from a single pixel in the light emitting system. Such an arrangement provides for reduced power consumption. For example, pixel 520 need only emit as much light as required by the brightest pixel in pixel group 720. In some cases, such as when a pixel in the light emitting system corresponds to and illuminates a subset of pixels in the SLM, the light emitting system may be used to illuminate the SLM as an adaptive illuminator, meaning that the output light intensity of a pixel in the light emitting system can be actively adjusted to provide the minimum illumination required by the corresponding subset of the pixels in the SLM, where the minimum required illumination is determined, at least in part, by the brightest pixel in the subset of pixels. In general, adaptive illumination can result in reduced power consumption by, for example, a display that utilizes the adaptive illumination.

Figure 8:
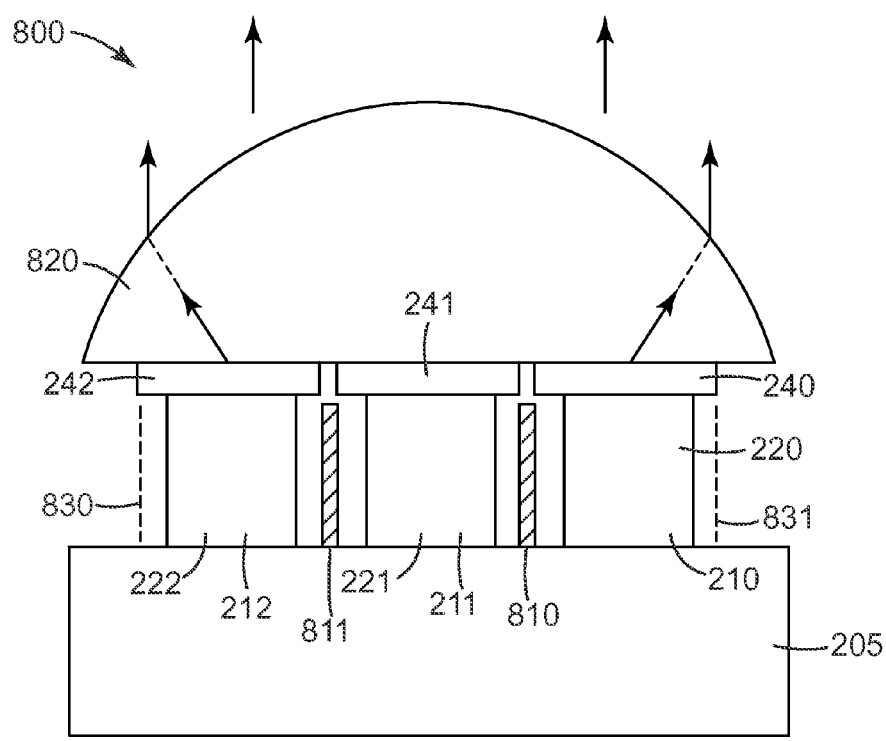
FIG. 8 is a schematic side-view of a light emitting system.

FIG. 8 is a schematic side-view of a light emitting system 800 that includes luminescent elements 210-212. A light blocking element is disposed between adjacent luminescent elements to reduce or eliminate optical cross talk between, for example, adjacent luminescent elements. In particular, light emitting system 800 includes a light blocking element 810 disposed between luminescent elements 210 and 211 and a light blocking element 811 disposed between luminescent elements 211 and 212.

In some cases, a light blocking element can be an optically absorbing element absorbing some, most, or essentially all light that would otherwise propagate from one luminescent element to a neighboring luminescent element. In some cases, a light blocking element can include a reflective material, such as a metal coating, for reflecting light. In some cases, a light blocking element can include a low index region, such as an air gap, for reflecting light by total internal reflection.

Light emitting system 800 further includes a light extractor 820 that extends across multiple luminescent elements. In particular, light extractor 820 extends across luminescent elements 210-212. Light extractor 820 extracts light by optically coupling to the luminescent elements. In particular, light extractor 820 is optically coupled to light converting elements 240-242.

In some cases, light extractor 820 can redirect light emitted by luminescent elements 210-212. For example, light extractor 820 can collimate, at least to some extent, light that is extracted from the luminescent elements. In some cases, light that is extracted by the light extractor has a first angular spread and light that exits the light extractor has a second angular spread. In such cases, light extractor 820 can have a collimating effect if the second angular spread is less than the first angular spread. In some cases, light extractor 820 can have a hemispherical profile.

The luminescent elements in light emitting system 800 define outermost edges 830 and 831 of the light emitting region. In some cases, light extractor 820 can extend beyond the outermost edges of the light emitting region to increase light extraction efficiency.

Figure 9:
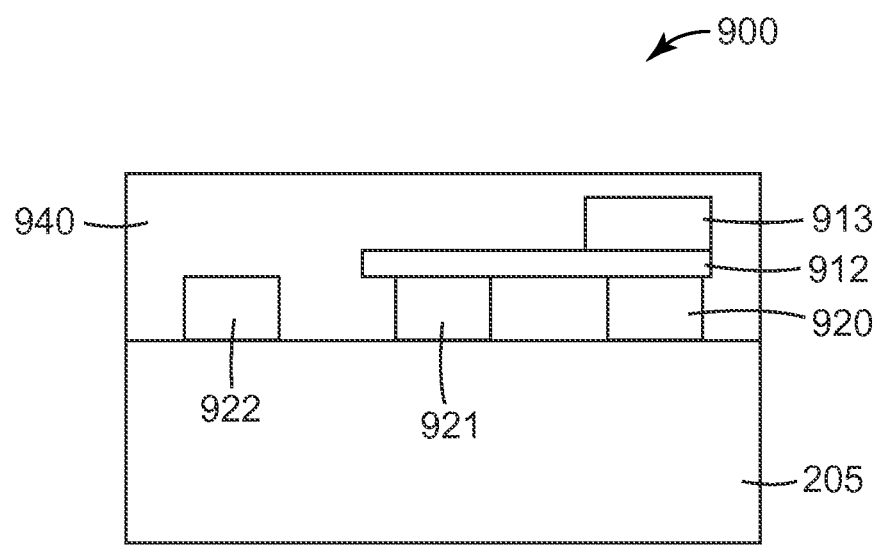
FIG. 9 is a schematic side-view of a light emitting system.

FIG. 9 is a schematic side-view of a light emitting system 900 that includes a plurality of electroluminescent devices, such as electroluminescent devices 920-922, formed on substrate 205. In some cases, each electroluminescent device corresponds to a different luminescent element in light emitting system 900. In some cases, each of the electroluminescent devices is capable of emitting light at a first wavelength, such as a blue wavelength.

Light emitting system 900 further includes a light converting element 912 that extends across multiple electroluminescent devices. In particular, light converting element 912 covers electroluminescent devices 920 and 921. In some cases, light converting element 912 forms a continuous layer across multiple, such as two or three, luminescent elements.

Light converting element 912 is primarily designed to convert light from the first wavelength to a second wavelength, where the second wavelength can, for example, be a green wavelength. In some cases, a luminescent element corresponding to electroluminescent device 921 is capable of outputting light at the second wavelength.

Light emitting system 900 further includes a light converting element 913 that extends across a single electroluminescent device. In particular, light converting element 913 covers electroluminescent device 920 but does not cover any neighboring electroluminescent devices, such as device 921. In the exemplary light emitting system 900, no light converting element is disposed on electroluminescent device 922.

Light converting element 913 is primarily designed to convert light from the second wavelength to a third wavelength, where the third wavelength can, for example, be a red wavelength. In some cases, a luminescent element corresponding to electroluminescent device 920 is capable of outputting light at the third wavelength.

Light emitting system 900 further includes an optically transparent (for example, transparent to light incident from layers below) or clear layer 940 that transmits light without any wavelength conversion. In some cases, layer 940 is primarily designed to planarize the output surface of light emitting system 900.

In some cases, the optical transmission of transparent layer 940 in a desired region(s) of the spectrum (for example, the blue region, the green region, the red region, or the visible region) can be, for example, greater than 50%, or greater than 70%, or greater than 80%.

In some cases, the first wavelength can correspond to blue light, the second wavelength can correspond to green light, and the third wavelength can correspond to red light.

In the exemplary light emitting system 1100 of FIG. 11, light converting element 1140 fully covers the emitting output surface of electroluminescent device 1120 and light converting element 1141 fully covers the output surface of light converting element 1140. In general, an upper layer may or may not fully cover the output surface of a lower layer. For example, in some cases, an upper layer can cover only a portion of a lower layer.

Figure 12:
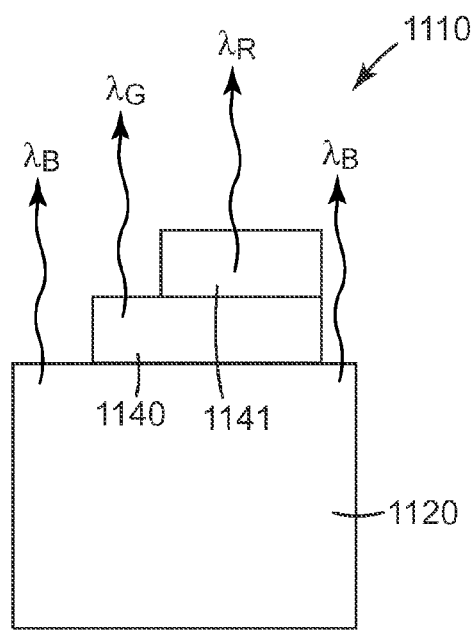
FIG. 12 is a schematic side-view of a luminescent element.

For example, as schematically shown in FIG. 12, light converting element 1140 partially covers output surface of electroluminescent device 1120 and light converting element 1141 covers only a portion of the output surface of light converting element 1140. In such cases, luminescent element 1110 is capable of outputting light that includes light at the first, second, and third wavelengths. In some cases, the first wavelength $\lambda_B$ is a blue wavelength, the second wavelength $\lambda_G$ is a green wavelength, and the third wavelength $\lambda_R$ is a red wavelength. In such cases, the output light of luminescent element 1110 includes blue, green, and red light that can, for example, combine to produce white or any other color light.

Light emitting systems disclosed in this application can be fabricated using methods commonly used in, for example, fabrication of microelectronic and semiconductor devices and other wafer-based devices. Known methods include molecular-beam epitaxy (MBE), metal-organic vapor-phase epitaxy (MOVPE), photolithography, wafer bonding, deposition methods and etching methods. An exemplary fabrication process for fabricating an active matrix light emitting system is schematically outlined in FIGS. 13A-13H. The process includes fabricating the various components of the light emitting system onto four different wafers, each designated a component wafer, and combining the four component wafers to construct a light emitting system. In particular, the electroluminescent devices are fabricated on a first substrate; the switching circuits for driving the electroluminescent devices are fabricated on a second substrate different than the first substrate; the light converting elements, such as potential or quantum wells, for converting light emitted by the electroluminescent devices are fabricated on a third substrate different from the first and second substrates; and the light extracting elements are fabricated on a fourth substrate different from the first, second, and third substrates. Next, the four substrates are attached to form a light emitting system.

Figure 13A:
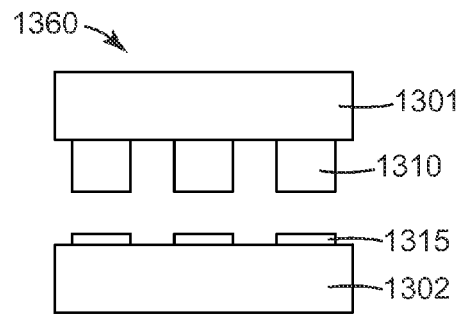
FIGS. 13A-13H are schematic representations of devices at intermediate stages or steps in a process for fabricating a light emitting system.

FIG. 13A is a schematic side-view of a first component wafer 1350 and a second component wafer 1360. First component wafer 1350 includes an array of switching circuits 1315 fabricated on a wafer or substrate 1302. In general, each switching circuit can include one or more transistors and one or more capacitors. In some cases, the switching circuits can be first fabricated individually and then integrated onto substrate 1302. In some other cases, the switching circuits can be fabricated directly onto substrate 1302 resulting in a monolithically integrated array of switching circuits. The switching circuits can be fabricated using, for example, conventional methods for fabrication of thin film microelectronic circuits that employ, for example, additive and/or subtractive fabrication processes. An additive process typically includes the steps of photolithography, deposition, and lift-off. A subtractive processing typically includes the steps of deposition, photolithography, and etching.

A switching circuit typically includes active layers, electrically conductive electrode layers such as metal electrode layers, and electrically insulative layers such as metal oxide layers. Typical materials used for an active region of a transistor in a switching circuit include single crystal silicon, amorphous or polycrystalline silicon, or other materials that may be suitable as a transistor active layer. Exemplary materials for use as an electrically conductive electrode include Al, Cu, Au, Ni or any other metal that may be suitable in an application. Exemplary material compositions for use as an electrically insulative layer include $SiO_x$ such as $SiO_2$, $Al_2O_3$, $Si_3N_4$ or any other electrically insulative material that may be suitable in an application. Exemplary deposition methods include physical vapor deposition such as thermal evaporation, electron beam deposition or sputtering; chemical vapor deposition such as MOCVD, PECVD, LPCVD, MBE or reactive sputtering; or any other method that can suitably be used in an application.

First component wafer 1350 may include other layers, such as passivation layers, protective layers, and planarization layers for planarizing the wafer. In some cases, one or more planarization layers may be included to planarize the top surface of the first component wafer for improved subsequent bonding to another wafer.

In some cases, substrate 1302 can be a Si substrate, a GaN substrate, or a SiC substrate. In general, substrate 1302 can be any substrate that may be suitable in an application.

Second component wafer 1360 includes an array of electroluminescent devices 1310 disposed on a wafer or substrate 1301. In some cases, the electroluminescent devices can include light emitting diodes (LEDs) that can be fabricated utilizing an array of known methods and materials.

In some cases, electroluminescent devices 1310 can be monolithically integrated by virtue of, for example, being formed directly onto substrate 1301 using photolithography, etching methods, and epitaxial or quasi-epitaxial deposition methods in, for example, an MOCVD system. In some cases, substrate 1301 can be a sapphire wafer, or any other material compatible with, for example, growth of LED materials.

In some cases, electroluminescent devices 1310 can include transparent electrically conductive layers such as indium tin oxide (ITO) layers, planarization layers, passivation layers, bonding layers for a subsequent bonding to another wafer, vias, and light blocking elements similar to, for example, light blocking element 810.

Figure 13D:
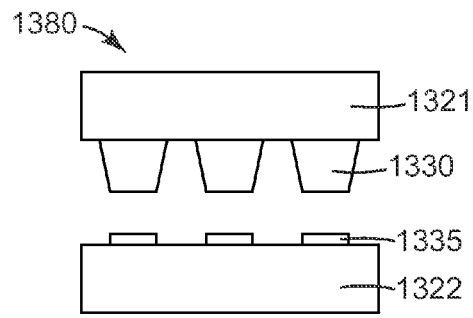
Figure 13B:
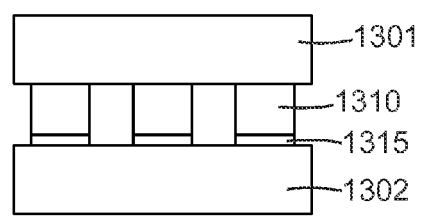

In some cases, after first component wafer 1350 and second component wafer 1360 are fabricated, the two wafers are bonded to each other with the active components facing each other as shown schematically in FIG. 13B. The bonding can be accomplished by, for example, bringing the top surfaces of the first and second component wafers into intimate contact or by applying one or more bonding layers during the bonding process. In some cases, the bonding layers can assist in providing electrical connection between electroluminescent devices 1310 and corresponding switching circuits 1315.

In some cases, electrical connection between corresponding features in wafers 1350 and 1360 can be accomplished by forming solder bumps on one or both wafers. After the solder bumps are formed, the two wafers are aligned and bonded to each other. In some cases, the bonding process may include one or more solder re-flow steps and one or more via patterning and/or filling. In some cases, wafers 1350 and 1360 can be aligned using IR illumination through one of the wafers. In cases where one or more of the wafers is optically transmissive in the visible region of the spectrum, alignment can be accomplished by using visible light illumination.

Figure 13E:
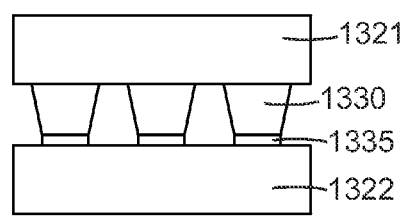
Figure 13C:
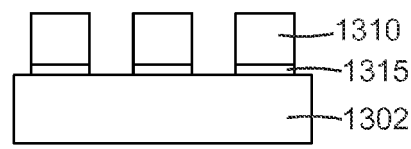

After wafers 1350 and 1360 are bonded, at least a portion of substrate 1301 is removed to expose electroluminescent devices 1310 as shown schematically in FIG. 13C. The removal of substrate 1301 can be carried out using, for example, an etching process or laser ablation.

FIG. 13D is a schematic side-view of a third component wafer 1370 and a fourth component wafer 1380 for fabrication of a light emitting system. Third component wafer 1370 includes an array of light converting elements 1335 disposed on a substrate 1322.

In some cases, light converting elements 1335 can include potential or quantum wells and one or more light absorbing layers for absorbing light that is emitted by a corresponding electroluminescent device. In some cases, the potential wells of light converting elements 1335 can include II-VI potential wells constructed on an indium phosphide (InP) wafer 1322.

In some cases, light converting elements 1335 can be directly fabricated on substrate 1322 by one or more deposition methods such as molecular beam epitaxy (MBE). Light converting elements 1335 may include one or more vias, planarization layers, passivation layers, optical blocking elements such as light blocking elements 810, and bonding layers for a subsequent bonding to another component wafer.

In general, a light control element in a luminescent element may or may not extend across neighboring luminescent elements. For example, in the exemplary third component wafer 1370 shown in FIG. 13D, each light converting element 1335 is dedicated to a single luminescent element and does not extend across other luminescent elements. In some cases, light converting elements 1335 may form a continuous layer across two or more luminescent elements or electroluminescent devices.

Fourth component wafer 1380 includes a plurality of light extractors 1330 disposed on a substrate 1321. In some cases, light extractors 1330 include light extracting elements and light management elements such as lenses for collimating the extracted light or steering the extracted light in one or more particular directions. In general, light extractors 1330 may be constructed in a variety of ways using a variety of materials. In some cases, light extractors 1330 can be fabricated in a mold and transferred onto substrate 1321, where the substrate can be a temporary substrate.

In some cases, after third component wafer 1370 and fourth component wafer 1380 are fabricated, the two wafers are bonded to each other with the extractors and LCEs facing each other as shown schematically in FIG. 13E. The bonding can be accomplished using any existing bonding layers in one or both wafers and/or by applying one or more additional bonding layers during the bonding process. After the completion of the bonding process, substrate 1322 is removed resulting in a construction shown schematically in FIG. 13F.

Figure 13F:
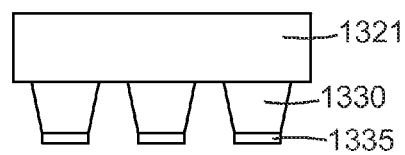
Figure 13G:
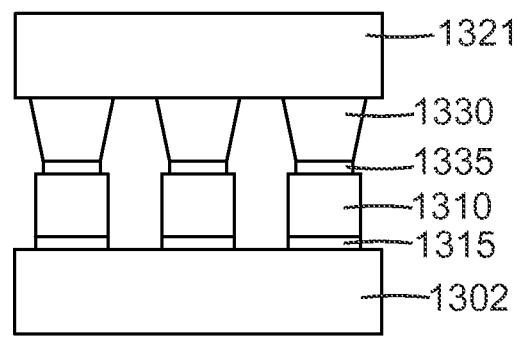
Figure 13H:
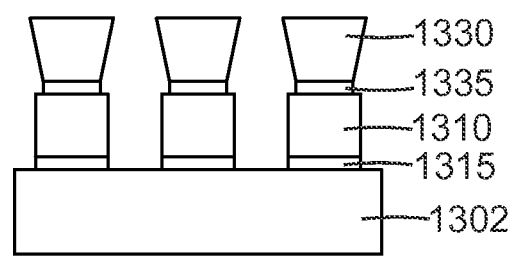

In some cases, after the two constructions of FIGS. 13C and 13F are fabricated, the two constructions are bonded to each other as shown schematically in FIG. 13G. Next, temporary substrate 1321 may be removed resulting in light emitting system 1300 shown schematically in FIG. 13H.

An exemplary fabrication process for fabricating an active matrix light emitting system capable of outputting white or any other color light is schematically outlined in FIGS. 10A-10F. The process includes fabricating the various components of the light emitting system onto two different wafers, each designated a component wafer, and combining the two component wafers to construct a light emitting system. In particular, the process includes forming two or more light converting elements and selectively removing one or more of the light converting elements to obtain a desired output spectrum.

The selective removal of the light converting elements may be accomplished by a variety of known methods such as wet or dry chemical etching or any combinations of the two. Exemplary dry chemical etching methods include reactive ion etching and focused ion beam etching. Exemplary patterning methods include photolithography.

Figure 10A:
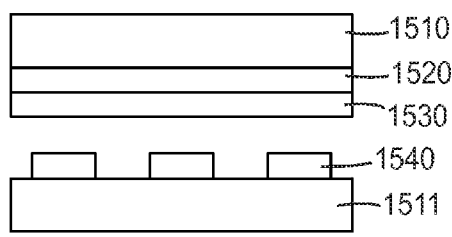
FIGS. 10A-10F are schematic representations of devices at intermediate stages or steps in a process for fabricating a light emitting system.

FIG. 10A is a schematic side-view of a first component wafer 1060 and a second component wafer 1070. First component wafer 1060 includes a first LCE 1520 disposed on a substrate 1510 and a second LCE 1530 disposed on LCE 1520. For ease of illustration and discussion and without loss of generality, it is assumed that LCE 1520 is capable of down converting green light to red light, and light converting element 1530 is capable of down converting blue light to green light.

First component wafer 1060 may be fabricated using known fabrication methods, such as epitaxial deposition methods, carried out on a wafer substrate, such as an InP substrate. For example, a molecular-beam epitaxy (MBE) process may be used to deposit alloys of II-VI semiconductor materials on an InP substrate 1510 to form layers of potential or quantum wells as light converting elements 1520 and 1530.

Second component wafer 1070 includes a plurality of electroluminescent devices 1540 disposed on a substrate 1511. In some cases, the electroluminescent devices may be light emitting diodes (LEDs). In such cases, the LEDs may be constructed from III-V semiconductor materials including, for example, GaN using known fabrication methods such as vapor phase epitaxy (VPE) on a sapphire substrate 1511. In some cases, the LEDs can include such layers and/or components as electrodes, transparent electrical contacts, vias, and bonding layers. In general, electroluminescent devices 1540 can be fabricated using conventional methods used in the semiconductor micro-fabrication industry, such as by conventional photolithography methods and conventional etching and/or deposition methods.

Figure 10B:
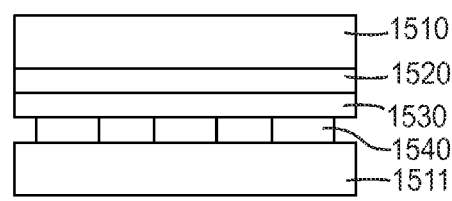

After first component wafer 1060 and second component wafer 1070 are fabricated, the two wafers are bonded to each other with the active components facing each other as shown schematically in FIG. 10B. The bonding may be carried out by, for example, direct wafer bonding or by disposing one or more bonding layers between the two wafers during the bonding process. A bonding layer may, for example, include one or more thin metal layers, one or more thin metal oxide layers, or one or more layers of other materials such as adhesives, encapsulants, high index glasses, or sol-gel materials such as low temperature sol-gel materials, or any combinations thereof.

In some cases, the thickness of a bonding layer may be in a range from about 5 nm to about 200 nm, or from about 10 nm to about 100 nm, or from about 50 nm to about 100 nm. The bonding between the two wafers may be accomplished by, for example, lamination or an application of temperature and/or pressure.

Figure 10C:
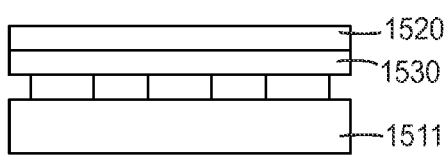

After first component wafer 1060 is bonded to second component wafer 1070, substrate 1510 of the first component wafer is removed resulting in the structure shown schematically in FIG. 10C. Substrate 1510 can be removed using known methods such as wet chemical etching. In the case of an InP substrate 1510, the removal of the substrate can be accomplished by, for example, etching the substrate using, for example, a solution of hydrochloric acid and water.

In some cases, first component wafer 1050 may include a buffer layer, not shown in FIG. 10A, disposed on substrate 1510 between the substrate and LCE 1520. In such cases, the buffer layer may also be removed when removing substrate 1510. In the case of an InP substrate 1510, the buffer layer may include GaInAs. A GaInAs buffer layer can be removed by, for example, using an etching solution of adipic acid, ammonium hydroxide and hydrogen peroxide. The etching solution can be prepared by, for example, adding 30 mL of ammonium hydroxide (~30%) and 5 mL of hydrogen peroxide to 40 grams of adipic acid in 200 mL of water.

Figure 10D:
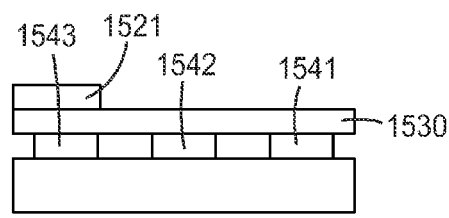

After substrate 1510 is removed, the light converting elements are selectively removed. For example, as shown in FIG. 10D, LCE 1520 is removed from areas covering electroluminescent devices 1541 and 1542 but not from the area covering electroluminescent device 1543. The selective removal of LCE 1520 results in LCE 1521 covering electroluminescent device 1543.

Figure 10E:
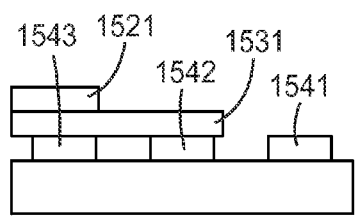
Figure 10F:
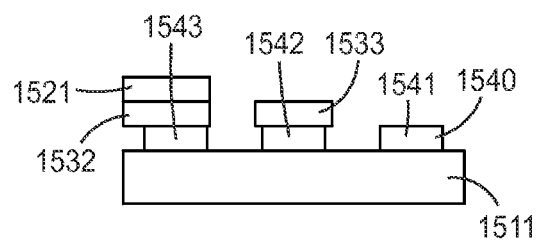

As part of the selective removal of the light converting elements, LCE 1530 is removed, as shown in FIG. 10E, from the area covering electroluminescent device 1541 but not from the areas covering electroluminescent devices 1542 and 1543. The selective removal of LCE 1530 results in LCE 1531 covering electroluminescent devices 1542 and 1543.

In the exemplary construction of FIG. 10E, LCE 1531 extends across electroluminescent devices 1542 and 1543. In some cases, a portion of LCE 1531 between the two corresponding electroluminescent devices may be removed, as shown schematically in FIG. 10F, resulting in LCE 1533 covering electroluminescent device 1542 and LCE 1532 covering electroluminescent device 1543. In such cases, LCE 1533 and LCE 1532 are from a same layer. In such cases, a light blocking element such as light blocking element 810 of FIG. 8, may be formed between electroluminescent devices 1542 and 1543 as well as, for example, between electroluminescent devices 1541 and 1542.

The removal of a light converting element can be accomplished by, for example, using known patterning and etching methods. Exemplary patterning methods include photolithography. Exemplary etching methods include wet etching. For example, a II-VI semiconductor light converting element can be etched using a solution that contains methanol and bromine.

Light emitting systems disclosed herein may be used in any application that light sources or image forming devices are currently being used or are anticipated to be used in the future. Exemplary applications include, but are not limited to, display systems, graphic display systems, signage systems, projection systems, liquid crystal displays, automotive headlamps, traffic signals, interior lighting, architectural or artistic lighting, general illumination, inspection and/or measurement systems, and any other application where the disclosed light emitting systems may be used.

As used herein, terms such as "vertical", "horizontal", "above", "below", "left", "right", "upper" and "lower", "top" and "bottom" and other similar terms, refer to relative positions as shown in the figures. In general, a physical embodiment can have a different orientation, and in that case, the terms are intended to refer to relative positions modified to the actual orientation of the device. For example, even if the construction in FIG. 2 is inverted as compared to the orientation in the figure, light extractor 270 is still considered to be on "top" of light converting element 240.

While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. A light emitting system, comprising:
 at least one first luminescent element capable of outputting light at a first wavelength;
 at least one second luminescent element capable of outputting light at a second wavelength different than the first wavelength; and
 at least one third luminescent element capable of outputting light at a third wavelength different than the first and second wavelengths and comprising:
  an electroluminescent device capable of emitting light at the first wavelength;
  a first photoluminescent element for converting at least a portion of light emitted by the electroluminescent device from the first wavelength to the second wavelength; and
  a second photoluminescent element for converting at least a portion of light emitted by the electroluminescent device or light converted by the first photoluminescent element to the third wavelength.

2. The light emitting system of claim 1, wherein the at least one first luminescent element comprises an electroluminescent device capable of emitting light at the first wavelength.

3. The light emitting system of claim 1, wherein the at least one second luminescent element comprises an electroluminescent device capable of emitting light at a fourth wavelength, and a photoluminescent element for converting at least a portion of light emitted by the electroluminescent device from the fourth wavelength to the second wavelength.

4. The light emitting system of claim 3, wherein the fourth wavelength is the same as the first wavelength.

5. The light emitting system of claim 1, wherein the first photoluminescent element comprises a potential well.

6. The light emitting system of claim 1, wherein the second photoluminescent element comprises a potential well.

7. The light emitting system of claim 1, wherein the first wavelength is in a blue region of the spectrum, the second wavelength is in a green region of the spectrum, and the third wavelength is in a red region of the spectrum.

8. The light emitting system of claim 1 comprising at least two second luminescent elements, each second luminescent element in the at least two second luminescent elements comprising an electroluminescent device capable of emitting light at the first wavelength and a photoluminescent element for converting at least a portion of light emitted by the electroluminescent device from the first wavelength to the second wavelength, wherein at least two photoluminescent elements in the at least two second luminescent elements form a continuous structure.

9. A light emitting system, comprising:
a plurality of electroluminescent devices capable of emitting light, wherein a first light converting element covers two or more electroluminescent devices for down converting at least a portion of light emitted by the two or more electroluminescent devices, and a second light converting element covers a portion of the first light converting element for converting at least a portion of light emitted by the first light converting element, wherein at least one of the first and second light converting elements comprises a potential well.

10. The light emitting system of claim 9, wherein at least one of the plurality of electroluminescent devices is an LED.

11. The light emitting system of claim 9 further comprising an optically clear layer for planarizing a light emitting side of the light emitting system.

12. A light emitting system, comprising:
at least one first luminescent element capable of outputting light at a first wavelength; and
at least one second luminescent element capable of outputting light at a second wavelength different from the first wavelength and comprising:
an electroluminescent device capable of emitting light at the first wavelength;
a first light converting element for converting at least a portion of light emitted by the electroluminescent device from the first wavelength to a third wavelength different from the first and second wavelengths; and
a second light converting element for converting at least a portion of light converted by the first light converting element from the third wavelength to the second wavelength.

13. The light emitting system of claim 12, wherein at least one of the first and second light converting elements comprises a potential well.

* * * * *